United States Patent [19]

Yamashita et al.

[11] 4,438,417

[45] Mar. 20, 1984

[54] FILTER CIRCUIT UTILIZING A SURFACE ACOUSTIC WAVE FILTER

[75] Inventors: Kiyofumi Yamashita, Yokosuka; Toshikazu Kodama, Yokohama, both of Japan

[73] Assignee: Tokyo Shibaura Denki Kabushiki Kaisha, Kanagawa, Japan

[21] Appl. No.: 274,426

[22] Filed: Jun. 17, 1981

[30] Foreign Application Priority Data

Jun. 17, 1980 [JP] Japan .................................. 55-80865
Feb. 25, 1981 [JP] Japan .................................. 56-25445

[51] Int. Cl.³ ..................... H03H 9/125; H03H 9/64
[52] U.S. Cl. ..................................... 333/193; 333/196
[58] Field of Search .............................. 333/150-155, 333/193-196; 310/313 R, 313 A, 313 B, 313 C, 313 D; 29/25.35

[56] References Cited

U.S. PATENT DOCUMENTS

2,075,181  3/1937  Curtis .................................... 333/178
3,446,974  5/1969  Seiwatz ........................... 333/196 X
3,582,838  6/1971  DeVries .............................. 333/194
4,316,220  2/1982  Muterspaugh et al. ......... 333/196 X

OTHER PUBLICATIONS

Hannah et al.–"Broadband Surface-Acoustic-Wave Delay Lines Using Weakly Piezoelectric Substrates," Wave Electronics, 3 (1977/1978); pp. 97–105.

*Primary Examiner*—Marvin L. Nussbaum
*Attorney, Agent, or Firm*—Oblon, Fisher, Spivak, McClelland & Maier

[57] ABSTRACT

A filter circuit having a surface acoustic wave filter device which includes a piezoelectric substrate and the input and output transducers disposed on the surface of the substrate, an inductance element connected with the input or output transducer, and, a variable resistor connected in parallel with the inductance element for adjusting the Q-factor value of a resonant circuit comprising the inductance element and capacitance of the surface acoustic wave filter device.

3 Claims, 8 Drawing Figures

FILTER CIRCUIT UTILIZING A SURFACE ACOUSTIC WAVE FILTER

BACKGROUND OF THE INVENTION

1. Field of the Invention

This invention relates to a filter circuit utilizing a surface acoustic wave filter device (hereinafter referred to as a SAW filter device) and more particularly, a filter circuit suitable for a band-pass filter connected to an amplifier for a vestigial side band system (hereinafter referred to as VSB) of a TV broadcast transmitter requiring an ideal frequency response.

2. Description of the Prior Art

A conventional band-pass filter circuit for a VSB comprises a plurality of tuning circuit elements each of which has an inductor and a capacitor. However, a great deal of time is spent in adjusting the value of inductance and capacitance of such elements so that the filter circuit elicits a predetermined frequency response. Further, the band-pass filter circuit is costly because it requires many tuning circuit elements to improve its frequency response.

In recent years, instead of the filter circuit utilizing the tuning elements, a SAW filter device is applied to the band-pass filter circuit.

A SAW filter circuit utilizing a SAW filter device presents an excellent frequency response, however the SAW filter device has a large amount of internal capacitance existing in the input electrode and output electrode. The internal capacitance is not desirable because it acts as a reactance load increasing the insertion loss. In order to minimize the insertion loss, an inductance element which cancels the capacitance of the SAW filter is connected in parallel with an output electrode of the SAW filter device. However the total frequency response of a SAW filter circuit deteriorates because of the inductance element. Thus, the ordinary SAW filter is not utilized for a VSB filter circuit.

SUMMARY OF THE INVENTION

An object of this invention is to provide a surface acoustic wave (SAW) filter circuit which utilizes a SAW filter which represents a good frequency response suitable for a band-pass filter of a vestigal side band (VSB) amplifier.

According to this invention, a SAW filter circuit comprises a SAW filter device having a piezoelectric substrate and an input transducer mechanically coupled to the substrate as well as an output transducer mechanically coupled to the substrate which elicts a reverse-peak characteristic in the transmit band of the frequency response. The SAW filter further comprises an inductance element connected with the input transducer or output transducer to compensate for an internal capacitance existing in the input or output transducers, and, a variable resistor for adjusting the Q factor of a resonant circuit comprising the capacitance and the inductance.

DETAILED DESCRIPTION OF THE INVENTION

Figure 1:
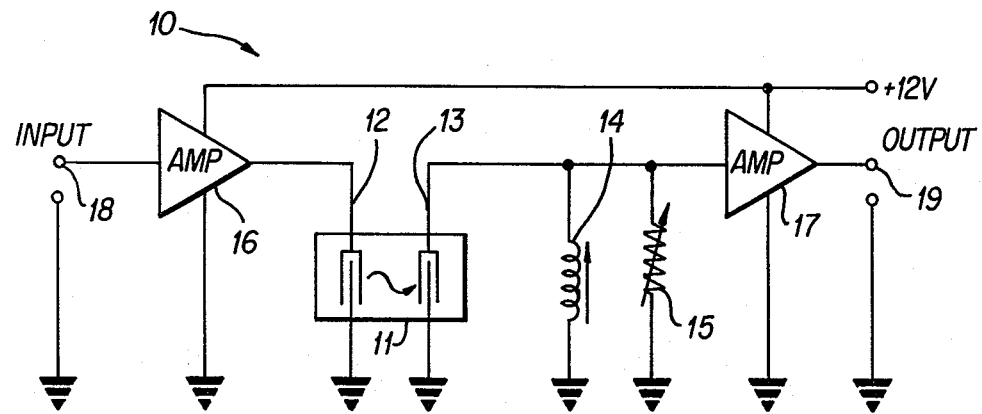
FIG. 1 is a circuit diagram of SAW filter circuit showing one embodiment of present invention.

In FIG. 1, a SAW filter circuit (10) suitable for band-pass filtering of a V.S.B. amplifier comprises a SAW filter device (11) having an interdigital type input transducer (12) and an interdigital type output transducer (13) provided on an piezoelectric substrate, an inductance element (14) connected in parallel with the output transducer (13), and, a variable resistor (15) connected in parallel with the output transducer (13). Further, a RF pre-amplifier (16), for example IC type No. AH404 manufactured by Alpha Co., Ltd. is connected in series with the input transducer (12), and, a RF buffer amplifier (17), for example IC type No. AH401 manufactured by Alpha Co., Ltd., is connected in series with the output transducer (13). The input signal is applied to the input terminal (18) and is obtained from the output terminal (19).

The total frequency response of the SAW filter circuit is obtained by adding the frequency response of the parallel circuit of the inductance element and the internal capacitance of the filter derive to the frequency response of the SAW filter device.

The SAW filter device utilizer for the filter circuit represents a unique frequency response different from that of a conventional SAW filter device. That is, as shown in curve A of FIG. 2, the SAW filter device (11) is designed so that its frequency response represents reverse-peak characteristic having a condition in which the amount of attenuation is slightly increased at the central frequency (36.53 MHz) in the transmit band of the device (11). A more detailed explanation of the SAW filter device (11) follows.

In the parallel circuit of the inductance element (14) and the internal capacitance, the inductance value of the inductance element (14) is to determined that the parallel circuit of the inductance element and the internal capacitance resonates at the central frequency (36.53 MHz) of the transmit band at which the attenuation amount of the SAW filter is large. Thus, the inductance element (14) reduces the insertion loss caused by the internal capacitance of the SAW filter device. In this circuit (11), the capacitance value of the internal capacitance is about 160 pF and the inductance value of the inductance element is about 0.12 $\mu$H.

Figure 3:
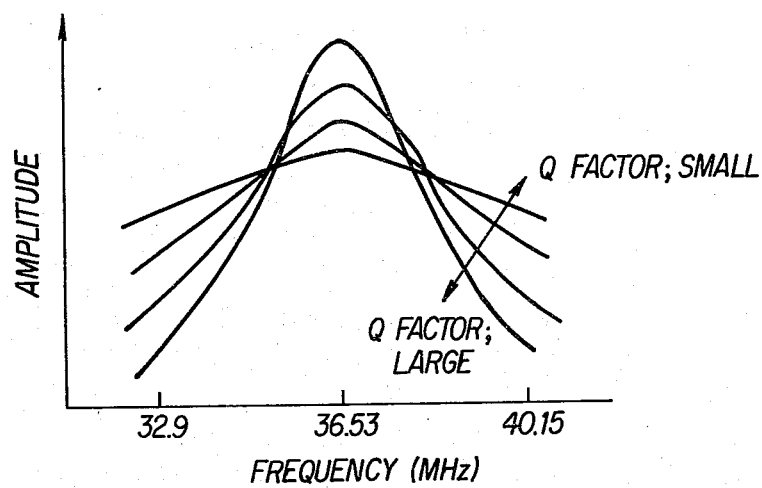
FIG. 3 is a graph showing the frequency response of the resonant circuit comprising the inductance element and internal capacitance of the device according to Q factor.

In the SAW filter circuit (10), because the resistor (15) acts as a damping resistance to the parallel circuit of the inductance element (14) and the capacitance, the resistor (15) controls the resonance curve of the parallel circuit to alter the Q-factor value of the parallel circuit. That is, the smaller the resistance value of the resistor (15) becomes, the smaller the Q-factor value becomes. And, as shown in FIG. 3, as the Q-factor value becomes smaller the slope of the resonant curve decreases. On the contrary, as the Q factor value becomes larger the slope of the resonant curve increases.

Figure 4:
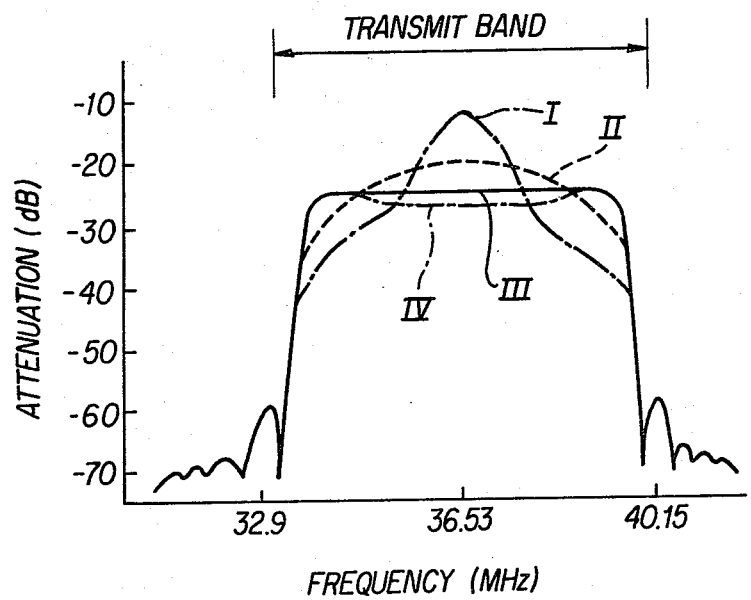
FIG. 4 shows the frequency response curve of the SAW filter circuit of FIG. 1.

Therefore as shown in FIG. 4, as the resistance value of the resistor (15) changes, the total frequency response of the circuit (10) changes. That is, when resistance value of the resistor (15) becomes larger, the frequency response of the circuit (10) changes from curve I to curve IV. Likewise, the circuit (11) can represent a frequency response shown in curve III of FIG. 4 by adjusting the resistance value of the resistor (15). That is, the resistor (15) can be adjusted to optimize the flatness of the frequency response in the pass band, and can be adjusted to keep the steep cutoff response at the cutoff frequencies. In this circuit (11), optimum resistance value of the resistor (15) is about 150Ω when the capacitance value of the internal capacitance is about 160 pF and the inductance value of the inductance element (14) is about 0.12 μH.

As described above, as the SAW filter circuit according to the invention comprises the inductance element compensating the internal capacitance in the transducer of the SAW filter device and the resistor compensating the frequency response of the SAW filter device, the insertion loss caused by the internal capacitance is minimized and the frequency response having a constant amount of attenuation through the transmit band of the filter circuit can be obtained. In the SAW filter circuit, the insertion loss is improved by 5 dB.

Figure 5:
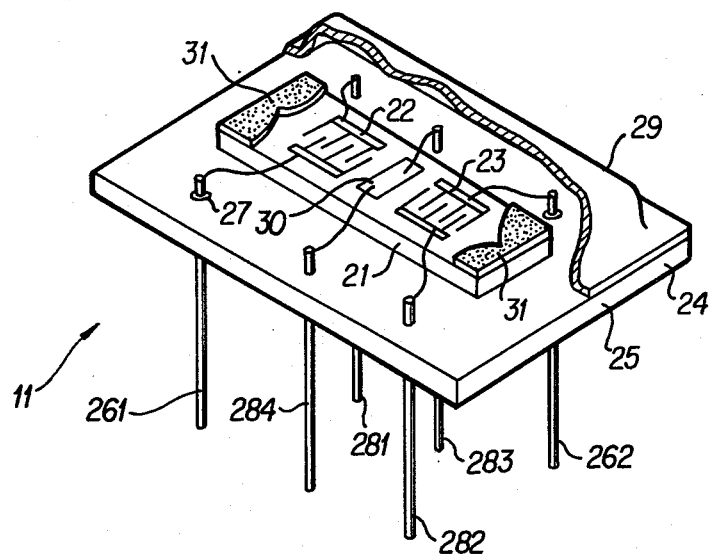
FIG. 5 is a schematical view of the SAW filter device utilized for the invention.
Figure 6:
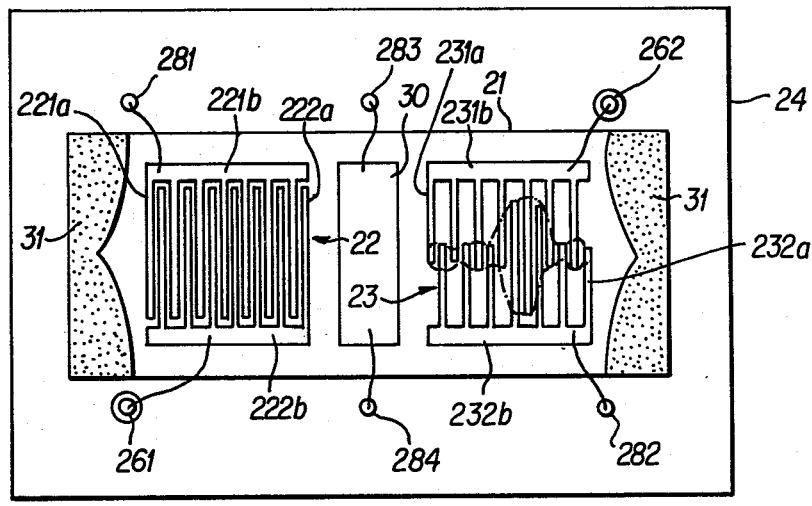
FIG. 6 is a plane view of the SAW filter device of FIG. 5.

The SAW filter device utilized for the filter circuit of the invention will now be discussed in conjunction with FIGS. 5 and 6. The SAW filter device (11) comprises piezoelectric substrate (21), for example lithium tantalate (LiTaO$_3$) or lithium niobate (LiNbO$_3$), providing an input transducer (22) and an output transducer (23) mechanically coupling with its surface, a stem (24) comprising a metal base (25) supporting the piezoelectric substrate (21) by an adhesive layer, first pins (261) (262) penetrating the base (25) through an insulative body (27), second pins (281) (282) (283) (284) penetrating the base (25), and, the shell (29) hermetically sealing the SAW filter device with a metal base (25). On the surface of the piezoelectric substrate (21), a shield electrode (30) which prevents the input and output transducer (22) (23) from electro-magnetically coupling with each other is provided between the input and output transducers (22) and (23), and, an absorber (31) which absorbes the acoustic surface wave reflected at both edges of the substrate (21) is provided.

The input transducer (22) comprises a pair of interdigital type first electrodes (221) (222) made of conductive material, for example aluminium of 5000 Å~1.5 μm thickness. Each of the first electrodes (221) (222) includes a plurality of split electrodes (221a) (222a) and bus bars (221b) (222b) bridging the end of the split electrodes (221a) (222a), respectively. The input transducer (22) is not weighted along the direction of propagation path of a surface acoustic wave.

The output transducer (23) comprises a pair of interdigital type second electrodes (231) (232) made of conductive material, for example aluminium of 5000 Å~1.5 μm thickness. Each of the electrodes (231) (232) includes a plurality of split electrodes (231a) (232a) and bus bars (231b) (232b) bridging the end of the split electrodes (231a) (232a), respectively. The output transducer (23) is weighted along the direction of propagation path of surface acoustic wave, that is, the length of the split electrode (231a) overlapping the split electrode (232a) in the direction of propagation path of surface acoustic wave is varied from one end of the split electrodes (231a) (232a) to the other end of the split electrodes (231a) (232a), so-called "apodization", so that the frequency response represents a "reverse-peak characteristic".

The bus bars (221b) (222b) of input transducer (22) are respectively connected with the pin (281) and the pin (261) by lead wires and the bus bars (231b) (232b) of output transducer (23) are respectively connected with the pins (262) (282) by lead wires. Likewise the shield electrode (30) is connected by lead wires to the pins (283) (284).

The SAW filter device which elicits a frequency response characteristic so that the frequency at which the amount of attenuation is maximized in the transmit band of the SAW filter device is different from the central frequency of the transmit band can be adapted to the SAW filter circuit of the invention. That is, in the SAW filter device having a frequency response shown in curve B of FIG. 2 the frequency at which the amount of attenuation is maximized in the transmit band of the SAW filter device is shifted to the upper side of the central frequency (36.53 MHZ). Also, in the SAW filter device having a frequency response shown in curve C of FIG. 2, the frequency at which the amount of attenuation is maximized in the band of the SAW filter device is shifted to the lower side of the central frequency.

Figure 2:
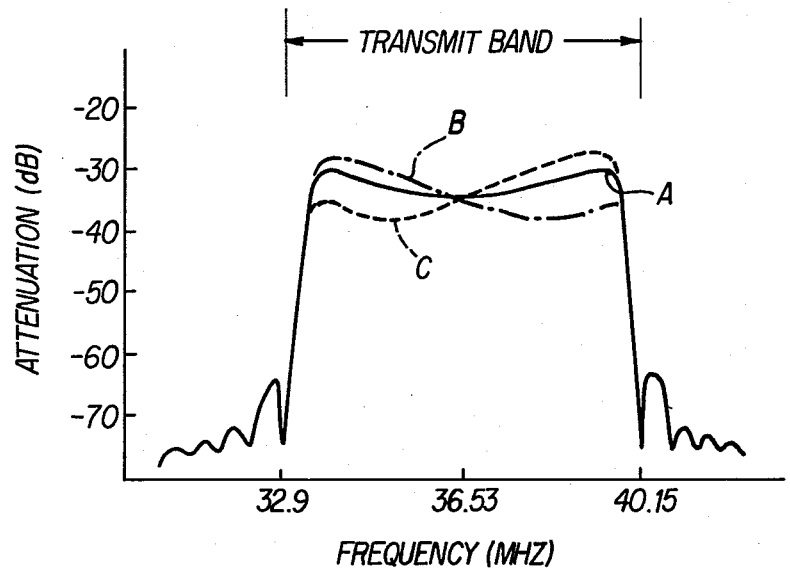
FIG. 2 shows the frequency response curve of the SAW filter device utilized for the SAW filter circuit of FIG. 1.

So, the "reverse-peak characteristic" means the frequency response indicated as curve B and C of FIG. 2 is similar to curve A of FIG. 2.

Figure 7:
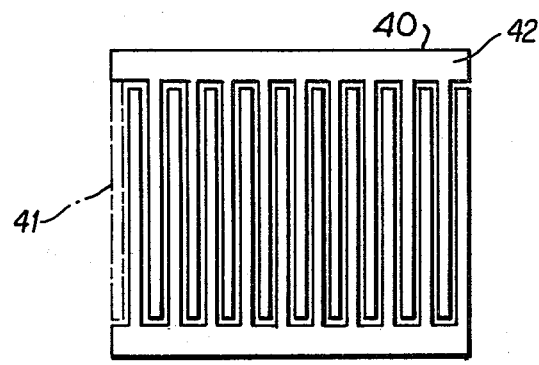
FIG. 7 is a plane view of another input transducer of the SAW filter device.

As shown in FIG. 7, the SAW filter device having the "reverse-peak characteristic" can be realized so that one of the split electrodes (41) of input transducer (40) is removed from the busbar (42), using the SAW filter device designed to represent the frequency response so that the amount of attenuation is constant throughout the transmit band.

Figure 8:
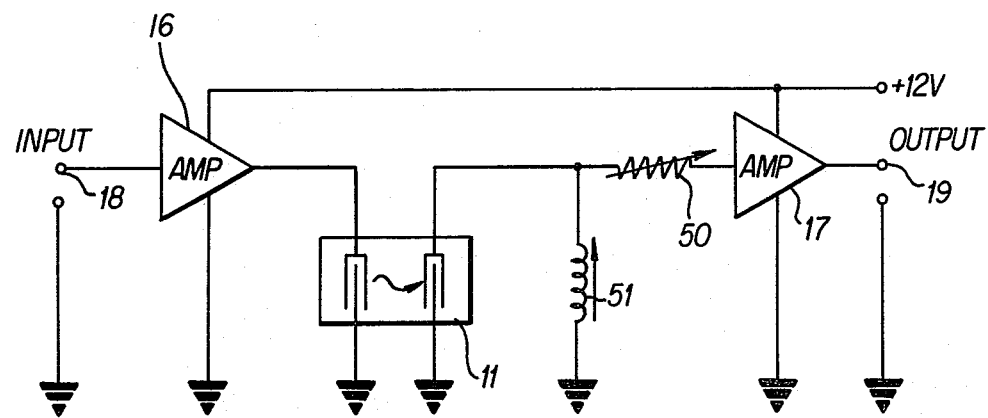
FIG. 8 is a circuit diagram of a SAW filter circuit showing another embodiment of present invention.

FIG. 8 shows another embodiment of this invention in which the resistor (50) connected in series with the parallel combination of the inductance element (51) and the SAW filter device (11) can adjust the Q factor value of the resonant circuit comprising the inductance element (51) and internal capacitance existing in the SAW filter device (11). This resistor also can alternatively be connected with the input transducer.

What is claimed as new and desired to be secured by Letter Patent of the United States:

1. A surface acoustic wave band-pass filter circuit comprising: a surface acoustic wave filter device including a piezoelectric substrate, and a uniform transducer and a weighted transducer which are disposed apart each other on a surface of the substrate, the uniform transducer comprising a first comb electrode and a second comb electrode, the first comb electrode having a first plurality of finger electrodes, and a first bus bar, bridging each end of said first plurality of electrodes, said second comb electrode having a second plurality of electrodes, said second plurality of electrodes being one less than the number of finger electrodes of a comb of a uniform transducer of a surface acoustic wave filter device designed to represent a frequency response which has a constant amoount of attenuation in a transmit band of the device, and a second bus bar bridging each end of said second plurality of finger electrodes, an inductance element connected to the weighted transducer of the surface acoustic wave device to compensate a capacitance existing in the transducer connected to the industance element; and
means for adjusting Q-factor of the resonant circuit formed by said inductance element and the capacitance of the surface acoustic wave filter device and for optimizing a flatness of a frequency response in the pass band of the band pass filter circuit.

2. A surface acoustic wave filter circuit according to claim 1 in which said adjusting means for adjusting comprises a resistor.

3. A surface acoustic wave filter circuit according to claim 2, in which said resistor is connected in parallel with said inductance element.

* * * * *

UNITED STATES PATENT AND TRADEMARK OFFICE
CERTIFICATE OF CORRECTION

PATENT NO. : 4,438,417
DATED : March 20, 1984
INVENTOR(S) : KIYOFUMI YAMASHITA ET AL It is certified that error appears in the above-identified patent and that said Letters Patent is hereby corrected as shown below:

Column 4, line 63, delete "amoount" and insert therefore --amount--.

Signed and Sealed this

Ninth Day of April 1985

[SEAL]

Attest:

DONALD J. QUIGG

Attesting Officer       Acting Commissioner of Patents and Trademarks